(12) United States Patent
Koh

(10) Patent No.: US 8,445,297 B2
(45) Date of Patent: *May 21, 2013

(54) METHOD OF FABRICATING A CHIP

(75) Inventor: Wei Koh, Irvine, CA (US)

(73) Assignee: Kingston Technology Corporation, Fountain Valley, CA (US)

(*) Notice: Subject to any disclaimer, the term of this patent is extended or adjusted under 35 U.S.C. 154(b) by 31 days.

This patent is subject to a terminal disclaimer.

(21) Appl. No.: 12/568,633

(22) Filed: Sep. 28, 2009

(65) Prior Publication Data

US 2010/0015736 A1 Jan. 21, 2010

Related U.S. Application Data

(63) Continuation of application No. 11/211,927, filed on Aug. 25, 2005, now Pat. No. 7,608,469.

(51) Int. Cl.
*H01L 21/66* (2006.01)

(52) U.S. Cl.
USPC .......... 438/18; 438/14; 438/15; 438/16; 438/17; 438/107; 438/108; 438/109

(58) Field of Classification Search ............. 438/14–18, 438/107–109
See application file for complete search history.

(56) References Cited

U.S. PATENT DOCUMENTS

| | | | |
|---|---|---|---|
| 5,173,840 A | 12/1992 | Kodai et al. | |
| 5,244,840 A | 9/1993 | Kodai et al. | |
| 5,677,568 A | 10/1997 | Ochi et al. | |
| 6,066,804 A | 5/2000 | Hamada et al. | |
| 6,240,329 B1 * | 5/2001 | Sun | 700/110 |
| 6,271,801 B2 | 8/2001 | Tuttle et al. | |
| 6,620,638 B1 | 9/2003 | Farrar | |
| 6,774,469 B2 | 8/2004 | Utsumi | |
| 6,843,421 B2 | 1/2005 | Chhor et al. | |
| 7,011,251 B1 * | 3/2006 | Miks et al. | 235/487 |
| 7,075,188 B2 | 7/2006 | Kato et al. | |
| 7,176,561 B2 | 2/2007 | Aoyagi | |
| 7,215,022 B2 | 5/2007 | Chan et al. | |
| 7,279,887 B1 | 10/2007 | King et al. | |
| 7,339,280 B2 | 3/2008 | Chuang et al. | |
| 7,378,301 B2 | 5/2008 | Koh et al. | |
| 7,608,469 B2 * | 10/2009 | Koh | 438/18 |
| 2004/0090829 A1 * | 5/2004 | Miura et al. | 365/200 |

* cited by examiner

*Primary Examiner* — Bac Au
(74) *Attorney, Agent, or Firm* — Sawyer Law Group, P.C.

(57) ABSTRACT

A method of fabricating a chip may include the step of providing a first electrical part. The method may also include the step of forming a shell with the first electrical part embedded in a first side portion of the shell and a cavity in a second side portion of the shell. The method may include the step of testing the embedded first electrical part to determine whether the first electrical part is defective or functional. The method may also include the steps of providing a second electrical part, inserting the second electrical part within the cavity of the shell second side portion, establishing electrical communication between the first and second electrical parts if a test result of the first electrical part indicates that the first electrical part is functional, and finishing the chip. Also, the method may include the step of rejecting the first electrical part if the test result of the first electrical part indicates that the first electrical part is defective.

5 Claims, 3 Drawing Sheets

METHOD OF FABRICATING A CHIP

CROSS-REFERENCE TO RELATED APPLICATIONS

This application claims the benefit of priority of U.S. patent application Ser. No. 11/211,927, entitled "METHOD OF FABRICATING A CHIP," filed on Aug. 25, 2005, which is incorporated herein by reference.

STATEMENT RE: FEDERALLY SPONSORED RESEARCH/DEVELOPMENT

Not Applicable

BACKGROUND

The present invention relates to a method of fabricating electronic chips, and more particularly, digital memory cards.

Electronic devices (e.g., computer) may contain many different types of electronic components such as memory cards and processors to name a few which are assembled together to build the electronic device. In the assembly of the electronic device, these electronic components may be received by an assembler. The assembler may begin to assemble the electronic device by attaching a first electronic component to an electronic board. Unfortunately, during the process of attaching the first electronic component to the electronic board, situations may arise that may harm the first electronic component. For example, the first electronic component may be soldered to the electronic board wherein the soldering process exposes the first electronic component to excessive heat thereby damaging the first electronic component. Despite the damaged first electronic component, the assembler may continue to attach second and third electronic components to the electronic board with the assumption that the first electronic component is still fully functional. However, at the end of the assembly process, the assembler may discover that the electronic device does not function as designed due to the damaged first electronic component. The assembler must then begin to debug the electronic device to locate and repair the damaged first electronic component at great expense and time.

Likewise, the manufacturer of the electronic component may encounter a similar type of problem when manufacturing or fabricating the electronic component. For example, in memory card fabrication, the memory card may comprise a plurality of electrical parts. For example, the memory card may include a memory integrated circuit, a lead frame, and a controller integrated circuit. These electrical parts may be electrically connected to each other and encapsulated within a molded shell. Unfortunately, the molding processes may harm the controller integrated circuit and/or the memory integrated circuit thereby preventing the memory card from functioning properly after molding. If the molding process damaged both electrical parts, then both electrical parts are rejected. Alternatively, if only one of the electrical parts was damaged by the molding process, both the defective and the non-defective electrical part must be discarded thereby wasting not only the defective electrical part but also the non-defective electrical part.

In certain instances, the electrical parts may be removed from the molded shell to salvage the non-defective part. Nonetheless, when either one of the electrical parts become defective due to the molding process, then the repair technician must consume time and energy to remove the defective electrical part, to repair the electrical part or to salvage the non-defective electrical part.

Accordingly, there is a need in the art for an improved method of fabricating an electronic component such as a memory card.

BRIEF SUMMARY

The method discussed herein in fabricating a chip addresses the problems identified above as well as other problems identified herein and those that are known in the art. In an aspect of the present invention, a chip is provided wherein a first electrical part is embedded in a shell, and a determination is made whether the first electrical part is defective or functional before a second electrical part is placed in communication with the first electrical part and committed thereto. If the first electrical part is determined to be defective, then the shell with the defective first electrical part may be rejected. Conversely, if the first electrical part or a test result of the first electrical part indicates that the first electrical part is functional or good then the second electrical part may be connected to the first electrical part. In this manner, second electrical parts are connected or committed only to functional first electrical parts thereby reducing or eliminating the possibility of wasting second electrical parts due to damaged first electrical parts.

In another aspect, a method of fabricating the chip is disclosed. A step of the method may comprise the step of providing a first electrical part. By way of example and not limitation, the first electrical part may be a controller IC for a flash memory chip. Preferably, the first electrical part may be less expensive than the second electrical part. It is preferable that the first electrical part be less expensive compared to the second electrical part because discarding the shell with the embedded first electrical part will be less expensive compared to discarding the shell with a more expensive second electrical part. The first electrical part may be provided to a chip fabricator in bulk. For example, a plurality of first electrical parts may be delivered to the chip fabricator in lots of one hundred (100), five hundred (500), one thousand (1,000) or more.

After the first electrical part has been provided to the chip fabricator, the chip fabricator may form a shell of the chip. In forming the shell of the chip, the chip fabricator may also embed one of the first electrical parts into each of the shells. For example, the shell may have a planar configuration defining a first side portion and a second side portion. The first electrical part may be embedded within the first side portion. Moreover, a lead frame may be electrically connected to the first electrical part and disposed within the second side portion to provide an electrical communications pathway between the first side portion, and more particularly, the first electrical part and the second side portion. The second side portion may be fabricated with a cavity which is sized and configured to receive the second electrical part. Moreover, the lead frame may have conductive traces and/or conductive pads exposed in the cavity which may be aligned to conductive pads of the second electrical part when the second electrical part is inserted into the cavity.

After the shell is formed, the first electrical part embedded in the shell may be tested with a tester. The tester may be placed in electrical communication with the first electrical part. The tester may also transmit an input signal to the first electrical part and may also be operative to receive a response signal from the first electrical part. The input signals transmitted to the first electrical part may activate various functions of the first electrical part wherein the functions of the first electrical part have a known or expected response signal. The tester may transmit the input signal and receive a response signal of the first electrical part. The tester may check to determine whether the received response signal corresponds to the known response signal in relation to the transmitted input signal.

The tester may also transmit a plurality of input signals activating a plurality of functions of the first electrical part and receive respective response signals. The tester may then determine whether the received response signals correspond to known response signals in relation to respective transmitted input signals. If all of the received response signals correspond to the known response signals in relation to the transmitted input signals then a test result of the first electrical part may indicate that the first electrical part is fully functional. Otherwise, a test result of the tester may indicate that the first electrical part is defective. If the first electrical part is defective, then the first electrical part and the shell may be rejected.

A second electrical part or a plurality of second electrical part may be provided to the chip fabricator. By way of example, and not limitation, the second electrical part may be a flash memory IC controllable by the first electrical part. After the first electrical part embedded in the shell is determined to be functional, the second electrical part is placed in electrical communication with the first electrical part. To this end, the second electrical part may be inserted into the cavity formed in the second side portion of the shell. More particularly, the second electrical part may have a plurality of contact pads on its underside. The contact pads may provide input/output electrical access to the second electrical part. The contact pads may be aligned with the conductive traces or conductive pads of the lead frame when the second electrical part is inserted into the cavity of the second side portion such that the second electrical part is placed in electrical communication with the first electrical part. The contact pads of the second electrical part may be bonded to the lead frame via soldering. The chip may be finished by filling in the cavity with a filler material.

The tester may now be attached or connected to the finished chip for testing. The tester may transmit input signals to the finished chip and receive response signals from the finished chip. The tester may correlate the received response signals to known response signals in relation to respective inputted signals. If all of the received signals correspond to the known response signals in relation to respective input signals, then the tester may indicate that the finished chip is functional. Otherwise, the tester may indicate that the finished chip is defective and the finished chip may be rejected. Alternatively, the tester may be attached to the chip prior to filling the cavity with the filler material for testing.

The method of fabricating the chip discussed herein increases manufacturing flexibility because the type of chip fabricated may be easily changed by using different first and second electrical parts combination. For example, the chip fabricator may fabricate a plurality of shells with a first electrical part embedded in each shell. The first electrical part may be operative to control a plurality of different types of second electrical parts. A lead frame may also be embedded in the shell which provides electrical communication between the first electrical part and the second electrical part. The lead frame may also be electrically connectable to the plurality of different types of second electrical parts such as a 512 MB memory IC or a 1 GB memory IC. The chip fabricator may stock a bulk quantity of 512 MB memory IC and a bulk quantity of 1 GB memory IC. The chip fabricator may connect 512 MB memory IC or 1 GB memory IC to the first electrical part embedded in the shell when an order for such memory chips are received by the chip fabricator.

Additionally, the method of fabricating the chip discussed herein reduces the cost to fabricate chips because less first and second electrical parts are discarded. The reason is that first electrical parts are only committed to functional second electrical parts, and conversely, second electrical parts are only committed to functional first electrical parts.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
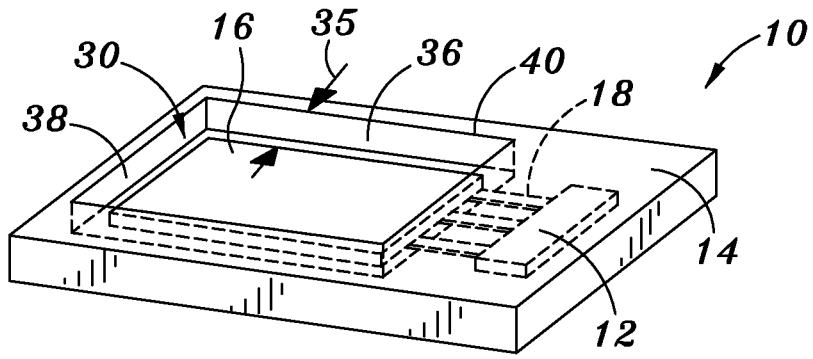
FIG. 1 is a perspective view of a chip with a first electrical part embedded in a shell of the chip and a second electrical part which was electrically connected to a lead frame after the first electrical part was determined to be functional.

Referring now to FIG. 1, a chip 10 is shown wherein a first electrical part 12 is embedded in a shell 14 and it is determined whether the first electrical part 12 is defective or functional before a second electrical part 16 is placed in communication with the first electrical part 12 and committed thereto. If the first electrical part 12 is determined to be defective, then the shell 14 with the defective first electrical part 12 is rejected. Conversely, if a test result of the first electrical part 12 indicates that the first electrical part 12 is functional or good then the second electrical part 16 is connected to the first electrical part 12. In this manner, second electrical parts 16 are connected or committed only to functional first electrical parts 12.

As will be discussed further herein, a method of fabricating the chip 10 and the structure of the chip 10 are disclosed. Although the chip 10 shown in FIG. 1 has two electrical parts, namely, first and second electrical parts 12, 16, it is contemplated that the method discussed herein may be employed with a chip 10 having three or more electrical parts. Accordingly, the drawings and description of the method and the chip structure discussed herein are for the purposes of illustration and not for the purpose of limiting the same.

Figure 2:
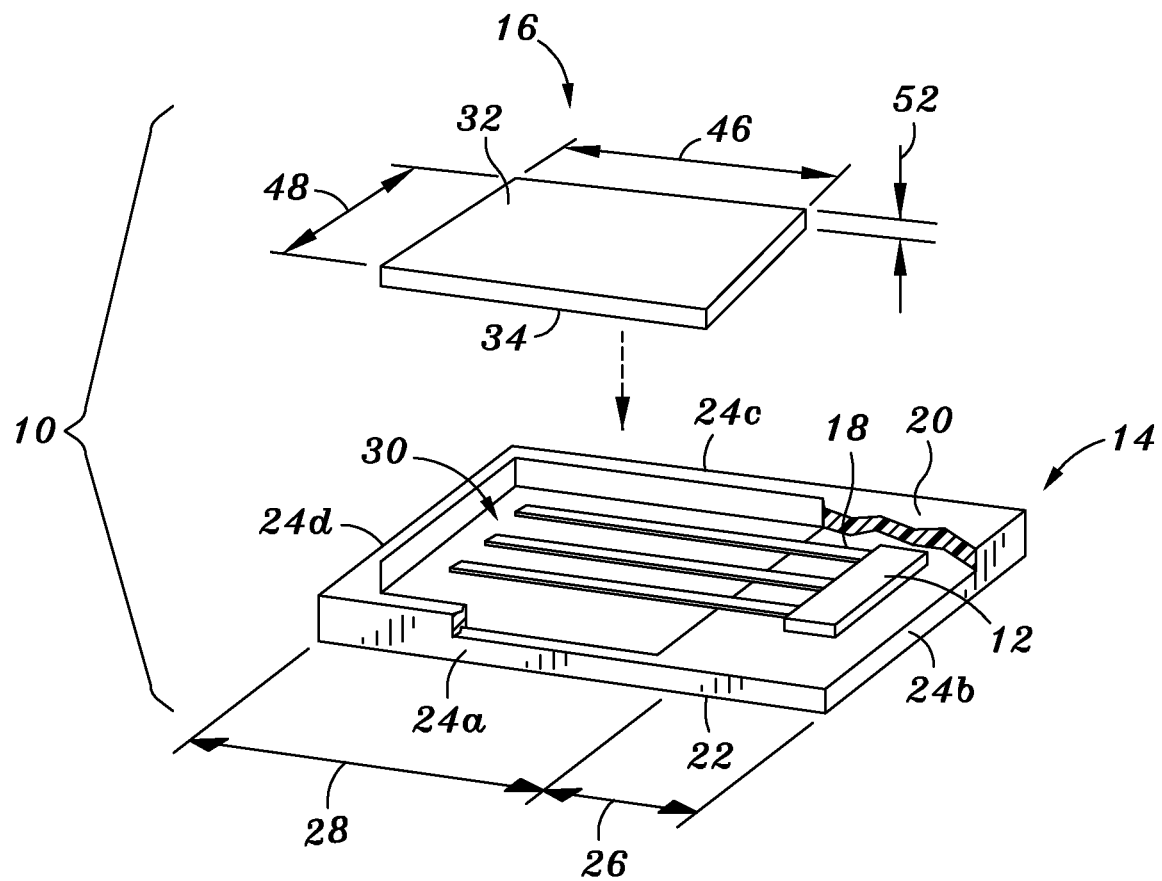
FIG. 2 is an exploded perspective view of the second electrical part being inserted into a cavity formed in a second side portion of the shell.

The chip 10 shown in FIG. 1 includes the shell 14, the first electrical part 12, a lead frame 18, and the second electrical part 16. It is also contemplated that the chip 10 may include passives such as resistors and capacitors depending on whether the chip incorporates conventional technology. The shell 14 may define an exterior surface which may be sized and configured to one of a plurality of standard chip configurations. For example, the shell exterior may be fabricated with a configuration of a system in package (SIP), multichop package (MCP), MMC, SD, Smart Media Cards, and their reduced size variations. As shown in FIG. 2, the shell 10 defines a top surface 20, bottom surface 22 and four side surfaces 24a-d.

As shown in FIG. 2, the shell 10 may also define a first side portion 26 and a second side portion 28. The first side portion 26 may have the first electrical part 12 embedded therein, and a cavity 30 may be formed in the second side portion 28. The first side portion 26 and the second side portion 28 may also have passives embedded therein depending on whether the chip 10 employs conventional technology. The cavity 30 may be sized and configured to receive the second electrical part 16. The lead frame 18 may also be embedded in the first side portion 26 and electrically connected to the embedded first electrical part 12. The lead frame 18 may be exposed within the cavity 30 of the second side portion 28. More particularly, the lead frame 18 may have a plurality of conductive traces and/or conductive pads. Distal ends of the conductive traces and/or the conductive pads may be disposed within the cavity 30 and exposed such that the second electrical component 16 when inserted into the cavity 30 may be electrically connected to such conductive traces and/or conductive pads.

The first electrical part 12 may be a controller IC which controls or allows access to the second electrical part 16. For example, in flash memory technology, the first electrical part 12 may be a controller IC and the second electrical part 16 may be the memory IC. The controller IC controls access to the memory IC such that data may be downloaded and/or uploaded to the memory IC via the controller IC.

The cavity 30 may be sized and configured to receive the second electrical part 16. The second electrical part 16 may be a memory IC. The second electrical part 16 may define opposed top and bottom surfaces 32, 34 (see FIG. 2). Conductive pads may be formed on the bottom surface 34 of the second electrical part 16. These conductive pads are electrical input/output access to the logical circuitry of the second electrical part 16. The conductive pads may be alignable to the conductive traces and/or conductive pads of the lead frame 18.

The lead frame 18 may be electrically connected to different types of second electrical parts 16. For example, the second electrical part 16 may be a 512 MB memory IC or a 1 GB memory IC. The lead frame 18 may be electrically connectable to the 512 MB memory IC or the 1 GB memory IC.

As shown in FIG. 1, a space 35 exists between the second electrical part 16 and an interior surface 36 of the cavity 30. A filler material 38 may fill the space 35 between the second electrical part 16 and the cavity interior surface 36, as shown in FIG. 7. The filler material 38 may resemble the shell material so as to make the rim 40 of the cavity's open top hidden from a viewer.

Figure 3:
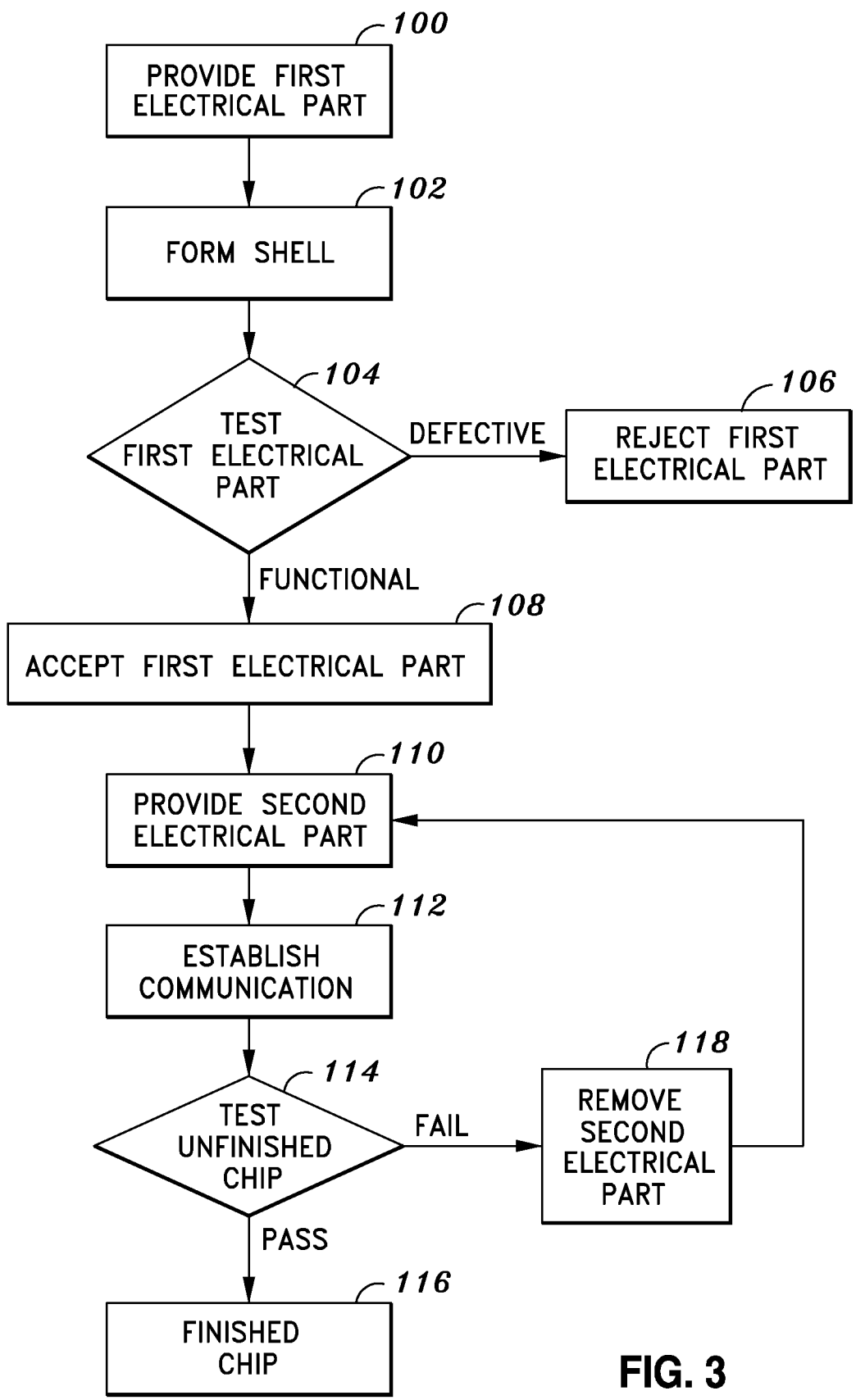
FIG. 3 is a flowchart of steps for fabricating the chip of FIG. 1 illustrating a step of testing the first electrical part prior to committing the second electrical part to the first electrical part.

Referring now to FIG. 3, a flow chart of the method of fabricating the chip 10 is shown. The method of fabricating the chip 10 may include the steps of providing 100 a first electrical part, forming 102 a shell, testing 104 a first electrical part, rejecting 106 the first electrical part if defective or accepting 108 the first electrical part 12 if functional, providing a second electrical part 110, establishing communication 112, testing the unfinished chip 114, removing 118 the second electrical part if the unfinished chip fails the test and beginning at step 110, and finishing 116 the chip if the unfinished chip passes the test. In the providing the first electrical part step 100, the first electrical part 12 may be provided to a chip fabricator in bulk such as in lots of 50, 100, 1000 or more. The first electrical part 12 may be a generic controller IC operative to control a plurality of different types of second electrical parts 16. For example, the controller IC may be operative to control a 512 MB memory IC and a 1 GB memory IC. The first electrical part 12 may have a plurality of functions. Each of the functions may be activated by transmitting a function specific input signal to the first electrical part 12. The first electrical part 12 may respond by transmitting a response signal which may be specific to the transmitted input signal.

Figure 4:
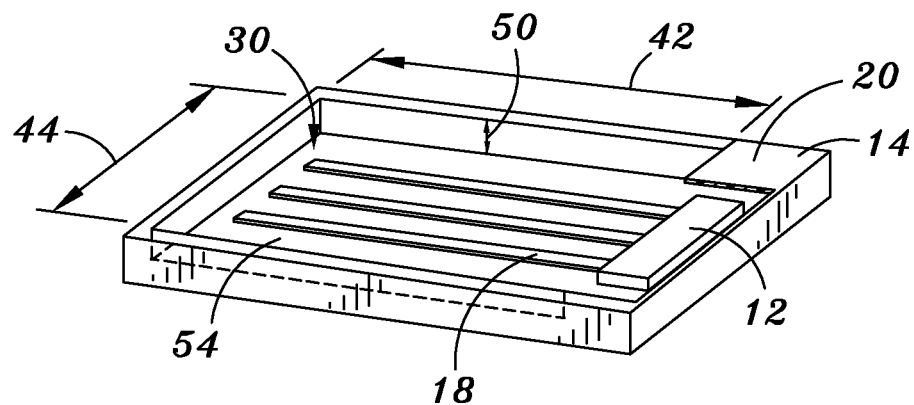
FIG. 4 is a perspective view of a shell with a first electrical part embedded therein and a leadframe attached to the first electrical part providing an electrical communications pathway from the first electrical part to the cavity of the shell second side portion.

In the forming the shell step 102, the first electrical part 12 may be embedded within the first side portion 26 of the chip shell 14 to be fabricated. More particularly, the first side portion 26 and the second side portion 28 may define the chip shell 14. The first side portion 26 may be sized and configured such that the entire first electrical part 12 is embeddable therewithin. It is also contemplated that passives such as resistors and capacitors be embedded in the first side portion 26 depending on whether the chip 10 incorporates conventional chip technology. The second side portion 28 may be adjacent to the first side portion 26 and fabricated as a unitary structure with the first side portion 26. The forming the shell step 102 may also include the step of forming the cavity 30 within the shell second side portion 28. The cavity 30 may have an opening for allowing the second electrical part 16 to be inserted into the cavity 30. As shown in FIGS. 2 and 4, a length 42 and a width 44 of the cavity 30 may be slightly larger than the length 46 and width 48 of the second electrical part 16. Further, a depth 50 of the cavity 30 may be equal to but is preferably slightly larger than a height 52 of the second electrical part 16 such that when the second electrical part 16 is inserted into the cavity 30, the top surface 32 of the second electrical part 16 may be equal to but is preferably below a plane of the top surface 20 of the shell 14.

The first electrical part 12 may be embedded within the shell 14 via plastic molding techniques. Alternatively, it is also contemplated that the first electrical part 12 be embedded within the shell 14 via forming a recess sized and configured to receive the first electrical part 12 in the first side portion 26. The recess with the first electrical part 12 received therein may also be filled with a filler material to encapsulate the first electrical part 12 within the shell first side portion 26.

The lead frame 18 may also be embedded within the shell 14 in the forming the shell step 102. The lead frame 18 may comprise a first set of contact pads that are electrically connectable to input/output contact pads of the first electrical part 12. The lead frame 18 may also comprise a second set of contact pads that are electrically connectable to input/output contact pads of the second electrical part 16. The first and second set of contact pads may be electrically connected to each other via conductive traces. The first set of contact pads may be embedded in the first side portion 26 of the shell 14 and electrically connected to the input/output pads of the first electrical part 12. The second set of contact pads may be disposed within the second side portion 28 of the shell 14. More particularly, the second set of contact pads may be disposed on a bottom surface 54 of the cavity 30. Conductive traces may electrically connect the first and second set of contact pads.

Figure 5:
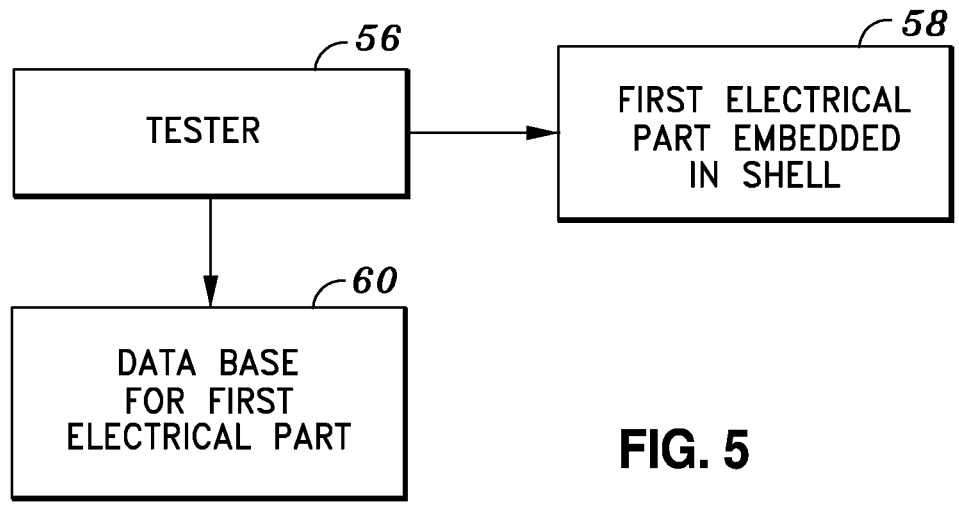
FIG. 5 is a block diagram of a tester having a database for the first electrical part, the tester is electrically connected to the first electrical part embedded in the shell for testing whether the first electrical part is functional or defective.

In the testing the first electrical part step 104, as shown in FIG. 5, a tester 56 may be connected to the first electrical part embedded within the shell 58 and operative to test whether the first electrical part 12 is defective or functional. The tester 56 may be operative to transmit a plurality of input signals to the first electrical part 12. Each input signal may activate one of a plurality of functions of the first electrical part 12. The tester 56 may have a database 60 of input signals with associated response signals. For example, the database may include information that first, second, etc. response signals should be received when first, second, etc. input signals, respectfully, are transmitted to the first electrical part 12.

The tester 56 may be connected to the first electrical part 12 and one of the input signals transmitted thereto to test a function of the first electrical part 12. The tester 56 may then receive a response signal from the first electrical part 12. If the received response signal is equal to a known response signal associated with the input signal as defined by the database 60, then the tested function is verified. Further, the tester 56 may transmit all of the input signals for the first electrical part 12 and receive response signals from the first electrical part 12. If all of the received response signals correspond to the known response signals associated with the respective transmitted input signals listed in the database 60, then it is known that the first electrical part 12 is fully functional. If less than all of the received response signals correspond to the known response signals associated with the respective transmitted input signals, then it is known that the first electrical part 12 is defective or not fully functional.

The first electrical part 12 embedded within the shell 14 may be rejected if a test result of the tester 56 indicates the first electrical part 12 as being defective. Conversely, the first electrical part 12 embedded within the shell 14 may be accepted if the test result of the tester 56 indicates that the first electrical part 12 is functional. If the first electrical part 12 is rejected, then the first electrical part 12 may be returned to the manufacturer of the first electrical part, discarded, recycled or the like. If the first electrical part 12 is accepted then the second electrical part 16 may be electrically connected to the first electrical part 12.

The chip fabricator may be provided with a plurality of different types of second electrical parts 16, as illustrated in FIG. 3 by step 110. For example, the chip fabricator may be provided with a plurality of 512 MB memory IC and a plurality of 1 GB memory IC. The second electrical part 16 may have input/output contact pads on an underside of the second electrical part 16. These input/output contact pads may be connected to the second set of contact pads of the lead frame 18. Moreover, the different types of second electrical parts 16 may have differently configured input/output contact pads. Nonetheless, the second set of contact pads of the lead frame 18 may be electrically connected to the input/output contact pads of the different types of second electrical parts 16.

The cavity 30 formed within the second side portion 28 may be sized and configured to universally receive the different types of second electrical parts 16. For example, the cavity 30 may be sized and configured to receive either the 512 MB memory IC or the 1 GB memory IC.

In the establishing communication step 112, a communications pathway between the first and second electrical parts 12, 16 may be established if a test result of the first electrical part 12 indicates that the first electrical part 12 is functional or functioning properly. The second electrical part 16 may be electrically communicable with the first electrical part 12 via the lead frame 18. In particular, the second electrical part 16 may be inserted into the shell's cavity 30. The input/output contact pads of the second electrical part 16 may be aligned to the second set of contact pads of the lead frame 18 and contacted therewith. The input/output contact pads of the second electrical part 16 may be attached to the second set of contact pads of the lead frame 18 via soldering.

Figure 6:
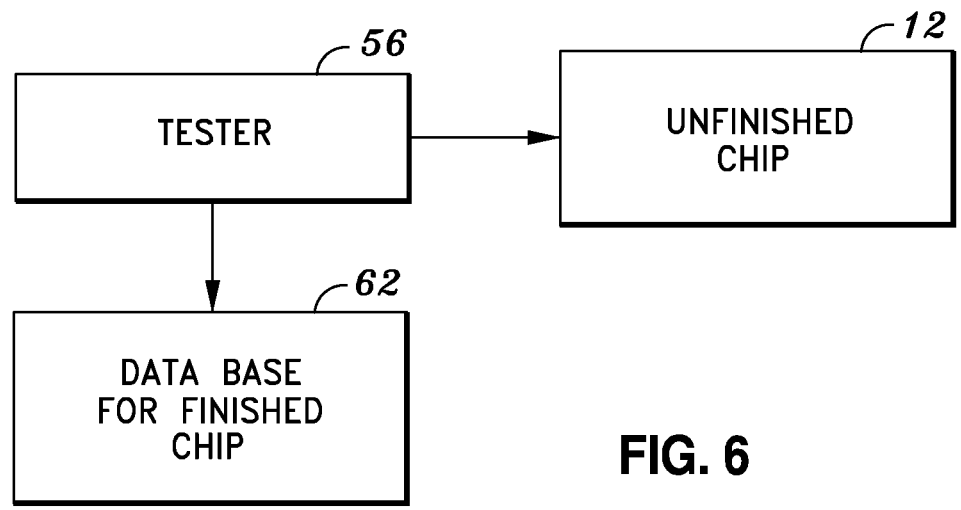
FIG. 6 is a block diagram of a tester having a database for a finished chip, the tester is electrically connected to an unfinished chip for testing whether the unfinished chip is functional or defective.

As shown in FIG. 6, the unfinished chip 12 may be electrically connected to the tester 56 to test 116 the unfinished chip 12. The tester 56 may transmit a plurality of different input signals to the unfinished chip 56 and receive response signals from the unfinished chip 56. The tester 56 may compare the received response signals to known response signals retrieved from database 62 in relation to respective input signals. If the received response signals match the known response signals in relation to respective input signals, then the tester 56 may indicate that the unfinished chip 12 is functional. However, if the received response signals do not match the known response signals in relation to respective input signals, then the tester 56 may indicate that the unfinished chip 12 is defective. If defective, then the second electrical part 16 is replaced (steps 118, 110 and 112) with a new second electrical part 16. If the unfinished chip 12 is functional, then the unfinished chip 12 is finished.

In the finishing the chip step 114, the cavity 30 in which the second electrical component 16 is disposed may be filled with the filler material 38, as shown in FIG. 7. A top surface of the filler material may be level with the top surface 20 of the shell 14.

The above description is given by way of example, and not limitation. Given the above disclosure, one skilled in the art could devise variations that are within the scope and spirit of the invention disclosed herein, including various ways of attaching the second electrical part 16 to the lead frame 18. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of fabricating an integrated circuit device, the method comprising the steps of:
    forming a shell with a first side portion and a second side portion, wherein a cavity is formed within the second side portion, wherein a first electrical part is embedded within the first side portion and electrically coupled via a first set of pads of a lead frame, the lead frame having integral and continuous distal end exposed portions that extend into the second side portion;
    testing the first electrical part by communicating at least one test signal from a tester to the first electrical part, wherein at least one response signal is generated by the first electrical part and is processed by the tester by comparing the at least one response signal to known response signals in a database to determine whether the first electrical part is functional; and
    wherein in response to the first electrical part being functional, embedding a second electrical part within the cavity and electrically coupling the second electrical part to the lead frame via a second set of pads of the lead frame, wherein the cavity is filled with a filler material to at least partially embed the second electrical part within the filler material if the second electrical part is functional.

2. The method recited in claim 1, wherein the cavity is filled with the filler material until the filler material is substantially flush with a top surface of the shell.

3. The method recited in claim 1, wherein the cavity is filled with the filler material to completely embed the second electrical part within the filler material.

4. The method recited in claim 1, wherein forming the shell includes forming the shell out of the filler material.

5. The method recited in claim 1, further including replacing the first electrical part if the first electrical part is defective and replacing the second electrical part if the second electrical part is defective.

* * * * *